(12) United States Patent
Geraghty et al.

(10) Patent No.: US 6,570,517 B1
(45) Date of Patent: May 27, 2003

(54) DIGITAL TO ANALOG CONVERTING CIRCUIT

(75) Inventors: Donal Geraghty, Limerick (IE); Patrick Kirby, Limerick (IE)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 09/858,932

(22) Filed: May 16, 2001

(51) Int. Cl.⁷ .................................................. H03M 1/00
(52) U.S. Cl. ...................................... 341/141; 341/144
(58) Field of Search ................................. 341/141, 142, 341/144, 155

(56) References Cited

U.S. PATENT DOCUMENTS

| | | | |
|---|---|---|---|
| 3,631,229 A | * 12/1971 | Bens ........................... | 235/153 |
| 6,172,627 B1 | 1/2001 | Nealy et al. | |
| 6,198,313 B1 | 3/2001 | Poucher et al. | |
| 6,169,505 B1 | * 1/2002 | Nishimura et al. ......... | 341/141 |

FOREIGN PATENT DOCUMENTS

EP  07147541  6/1995

OTHER PUBLICATIONS

International Search Report –PCT/IB02/06131.
* cited by examiner

Primary Examiner—Peguy JeanPierre
Assistant Examiner—Joseph J Lauture
(74) Attorney, Agent, or Firm—Wolf, Greenfield & Sacks, P.C.

(57) ABSTRACT

A multi-channel DAC having a digital input port (2) for receiving digital input codes and a plurality of analogue output terminals (OUT1 to OUTN) on channels (CH1 to CHN) on which corresponding analogue signals are outputted, comprises a primary DAC (3) which receives the digital input codes from the input port (2). Analogue signals from the primary DAC (3) are selectively and sequentially sampled onto infinite sample and hold circuits (SH1 to SHN) of the channel (CH1 to CHN) through primary switches PS1 to PSN) under the control of a primary control circuit (5). Each infinite sample and hold circuit (SH1 to SHN) comprises a secondary DAC (10) which outputs an analogue signal which closely approximates to the sampled analogue signal from the primary DAC (3) and which is held on the corresponding output terminal (OUT1 to OUTN). Secondary digital codes may be selectively applied to the secondary DACs 10 of the respective infinite sample and hold circuits SH1 to SHN for incrementing or decrementing the analogue signal held on the corresponding output (OUT1 to OUTN).

21 Claims, 5 Drawing Sheets

DIGITAL TO ANALOG CONVERTING CIRCUIT

FIELD OF THE INVENTION

The present invention relates to a digital to analogue converting circuit, and in particular to a multi-channel digital to analogue converting circuit for converting digital codes to analogue signals, and also to a single channel digital to analogue converting circuit.

BACKGROUND TO INVENTION

In multi-channel digital to analogue circuits for converting digital codes to analogue signals, in general, each channel of the circuit is provided with a digital to analogue converter (DAC). Such DACs typically comprise a plurality of impedance elements, which may be, for example, resistors or capacitors. In resistor DACs the transistors may, for example, be arranged in an R-2R ladder, a string or other suitable formation. In capacitor DACs the capacitor may, for example, be arranged in a binary weighted array or any other suitable arrangement. In order to ensure accuracy of each DAC, it is essential that the impedance elements within each DAC are accurately matched to each other, otherwise, the integral linearity of the DAC will be poor. Matching of such impedance elements in a DAC when implemented in integrated circuit chips is relatively difficult, and is also relatively expensive. In general, in order to adequately match the impedance elements a relatively large chip area is required for forming each DAC, which leads to significant expense and inefficiency. An alternative approach in the provision of relatively high accuracy DACs is to form the impedance elements of the respective DACs to be suitable for laser or fuse trimming. However, this also adds to the expense of producing such DACs. A further alternative approach is to provide on-chip calibration circuitry for storing algorithms to correct for mismatched impedance elements in the respective DACs. However, the provision of such on-chip calibration circuitry requires additional chip area, and thus adds to the expense of producing such DACs.

It is, however, known to provide a multi-channel digital to analogue circuit in which a single DAC is provided for converting a digital input code to an analogue signal, which is in turn sampled onto one or more of the channels of the multi-channel circuit. Each channel comprises a sample and hold circuit which samples and holds the analogue signal on an analogue output of the sample and hold circuit. While such multi-channel digital to analogue circuits avoid the need to provide a DAC for each channel, they suffer from a serious disadvantage in that typically the sample and hold circuits are capacitive circuits, and thus the analogue signal which is being held on the analogue output of each channel decays relatively rapidly. This requires periodic sampling of the output of the DAC in order to return the decaying analogue signal to its correct value. Relatively complex additional circuitry is required to carry out the periodic sampling of the DAC output. A further disadvantage of such a multi-channel circuit is that the analogue signal must be held on the DAC output to permit periodic sampling, thereby limiting the data throughput of such multi-channel circuits.

There is therefore a need for a multi-channel DAC which permits outputting of relatively accurate outputs on the respective channels, while at the same time minimising the number of accurate DACs required.

SUMMARY OF THE INVENTION

According to the invention there is provided a multi-channel digital to analogue circuit for converting digital codes to analogue signals, the circuit comprising:

a primary digital to analogue converter (DAC) for receiving digital input codes and outputting corresponding analogue signals, a plurality of infinite sample and hold circuits for sampling the analogue signals outputted by the primary DAC and for holding an analogue signal similar to that sampled from the primary DAC, the infinite sample and hold circuits defining respective analogue outputs of the multi-channel circuit, and a primary switching mechanism for selectively sampling analogue signals outputted by the primary DAC onto the infinite sample and hold circuits.

In one embodiment of the invention the primary switching mechanism sequentially samples the analogue signals outputted by the primary DAC onto respective selected ones of the infinite sample and hold circuits. Alternatively, the primary switching mechanism simultaneously samples the analogue signal outputted by the primary DAC onto respective selected ones of the infinite sample and hold circuits.

In another embodiment of the invention the primary switching mechanism comprises a plurality of primary switches, one primary switch being provided for each infinite sample and hold circuit for selectively sampling the analogue signal outputted by the primary DAC onto the corresponding infinite sample and hold circuit.

In a further embodiment of the invention a primary control circuit is provided for selectively addressing the primary switches of the primary switching mechanism.

In one embodiment of the invention each infinite sample and hold circuit comprises a secondary DAC having an analogue output from which the analogue signal held on the analogue output of the infinite sample and hold circuit is derived, and an analogue to digital converting circuit for deriving from each analogue signal sampled by the infinite sample and hold circuit a digital code which corresponds to an analogue signal from the secondary DAC which is similar to the sampled analogue signal, and for applying the derived digital code to the secondary DAC.

Preferably, the digital code derived by the analogue to digital converting circuit of each infinite sample and hold circuit is stored in the analogue to digital converting circuit until the next analogue signal is sampled by the infinite sample and hold circuit.

Preferably, each infinite sample and hold circuit is configurable to operate in an acquisition mode during which the digital code for the secondary DAC is derived, and in a hold mode during which the analogue signal outputted by the secondary DAC is held on the analogue output of the infinite sample and hold circuit.

In another embodiment of the invention the analogue to digital converting circuit of each infinite sample and hold circuit comprises a successive approximation register for deriving the digital code for the secondary DAC when the infinite sample and hold circuit is configured in the acquisition mode, and for latching the derived digital code onto the digital input of the secondary DAC when the infinite sample and hold circuit is configured in the hold mode.

In another embodiment of the invention a secondary switching mechanism is provided in each infinite sample and hold circuit for configuring the infinite sample and hold circuit to operate in the respective acquisition and hold modes, the secondary switching mechanism being responsive to the successive approximation register having derived the digital code for the secondary DAC for switching the infinite sample and hold circuit from the acquisition mode to the hold mode, and being responsive to the primary switching mechanism sampling the next analogue signal from the primary DAC to the infinite sample and hold circuit for switching the infinite sample and hold circuit from the hold mode to the acquisition mode.

In one embodiment of the invention each infinite sample and hold circuit comprises an amplifier which is configurable as a buffer when the infinite sample and hold circuit is configured in the hold mode for applying the output from the secondary DAC to the analogue output of the infinite sample and hold circuit, and the amplifier is configurable as a comparator when the infinite sample and hold circuit is configured in the acquisition mode for sequentially comparing the outputs of the secondary DAC with the sampled analogue signal from the primary DAC and for outputting corresponding signals to the successive approximation register for driving the successive approximation register to derive digital code for the secondary DAC.

In another embodiment of the invention a primary input is provided to the primary DAC for inputting a primary digital input code to the primary DAC, and at least one of the infinite sample and hold circuits is provided with a secondary input for inputting a secondary digital input code to the secondary DAC of the infinite sample and hold circuit for facilitating altering of the analogue signal on the analogue output of the infinite sample and hold circuit when the infinite sample and hold circuit is configured in the hold mode.

Preferably, each infinite sample and hold circuit is provided with a secondary input to the corresponding secondary DAC.

Advantageously, each secondary DAC is of higher resolution than the primary DAC.

In one embodiment of the invention the differential linearity of each secondary DAC is better than the differential linearity of the primary DAC.

In another embodiment of the invention the integral linearity of the primary DAC is better than the integral linearity of each secondary DAC.

Additionally, the invention provides a digital to analogue converting circuit comprising:

a primary DAC having a primary input thereto for receiving a primary digital input code to the primary DAC, an infinite sample and hold circuit for sampling the analogue signals outputted by the primary DAC and for holding an analogue signal similar to that sampled from the primary DAC on an analogue output of the infinite sample and hold circuit, the infinite sample and hold circuit comprising a secondary DAC having an analogue output from which the analogue signal held on the analogue output of the infinite sample and hold circuit is derived, an analogue to digital converting circuit for deriving from each analogue signal sampled by the infinite sample and hold circuit a digital code which corresponds to an analogue signal from the secondary DAC which is similar to the sampled analogue signal, and for applying the derived digital code to the secondary DAC, the infinite sample and hold circuit being configurable in an acquisition mode for deriving the digital code for the secondary DAC, and in a hold mode in which the analogue signal outputted by the secondary DAC is held on the analogue output of the infinite sample and hold circuit, and a secondary input being provided to the secondary DAC for inputting a secondary digital input code to the secondary DAC for altering the analogue signal on the analogue output of the infinite sample and hold circuit when the infinite sample and hold circuit is operating in the hold mode.

In one embodiment of the invention the secondary DAC is of higher resolution than the primary DAC for increasing the overall resolution of the digital to analogue circuit.

In another embodiment of the invention the differential linearity of the secondary DAC is better than the differential linearity of the primary DAC.

In a further embodiment of the invention the integral linearity of the primary DAC is better than the integral linearity of the secondary DAC.

ADVANTAGES OF THE INVENTION

The advantages of the invention are many. The multi-channel digital to analogue converting circuit according to the invention can be provided at relatively low cost with minimum area of an integrated circuit chip being required. By virtue of the fact that each infinite sample and hold circuit can independently and in theory, in time, infinitely hold an analogue signal on the corresponding analogue output terminal of the selected channel of the multi-channel circuit which is similar to the analogue output of the primary DAC, once the primary DAC is an accurate DAC having a relatively high integral linearity performance, the integral linearity performance of the secondary DACs is relatively unimportant. However, it is desirable that the secondary DACs should have a relatively high resolution, in other words, a relatively high differential linearity performance, in order that the analogue signal held on the analogue output relatively closely approximates to the sampled analogue signal. Accordingly, since it is only necessary for the primary DAC to have a relatively high integral linearity performance, it is only necessary to have the impedance elements, be they resistors, capacitors or otherwise, accurately matched in the primary DAC. Matching of the impedance elements in the secondary DACs is relatively unimportant. Accordingly, it is possible according to the invention to provide a multi-channel digital to analogue converting circuit wherein only one of the DACs, namely, the primary DAC need be an accurate DAC having a relatively high integral linearity performance.

By providing a secondary digital input for inputting secondary digital input codes to the secondary DACs of the respective infinite sample and hold circuits of the respective channels, it is possible by providing the secondary DACs with resolutions higher than the primary DAC to provide a multi-channel digital to analogue converting circuit with a resolution higher than the resolution of the primary DAC, the resolution of the multi-channel circuit being a function of the resolution of the respective secondary DACs.

When the circuit is provided as a single channel digital to analogue converting circuit it is possible to boost the resolution of the primary DAC by providing a secondary DAC with a higher resolution than the primary DAC, and the advantage of this is that once the primary DAC is of good integral linearity performance the integral linearity performance of the secondary DAC is relatively unimportant, all that is required of the secondary DAC is that it is of high resolution and of good differential linearity performance.

The invention will be more clearly understood from the following description of an embodiment thereof, which is given by way of example only, with reference to the accompanying drawings.

DETAILED DESCRIPTION OF THE INVENTION

Figure 1:
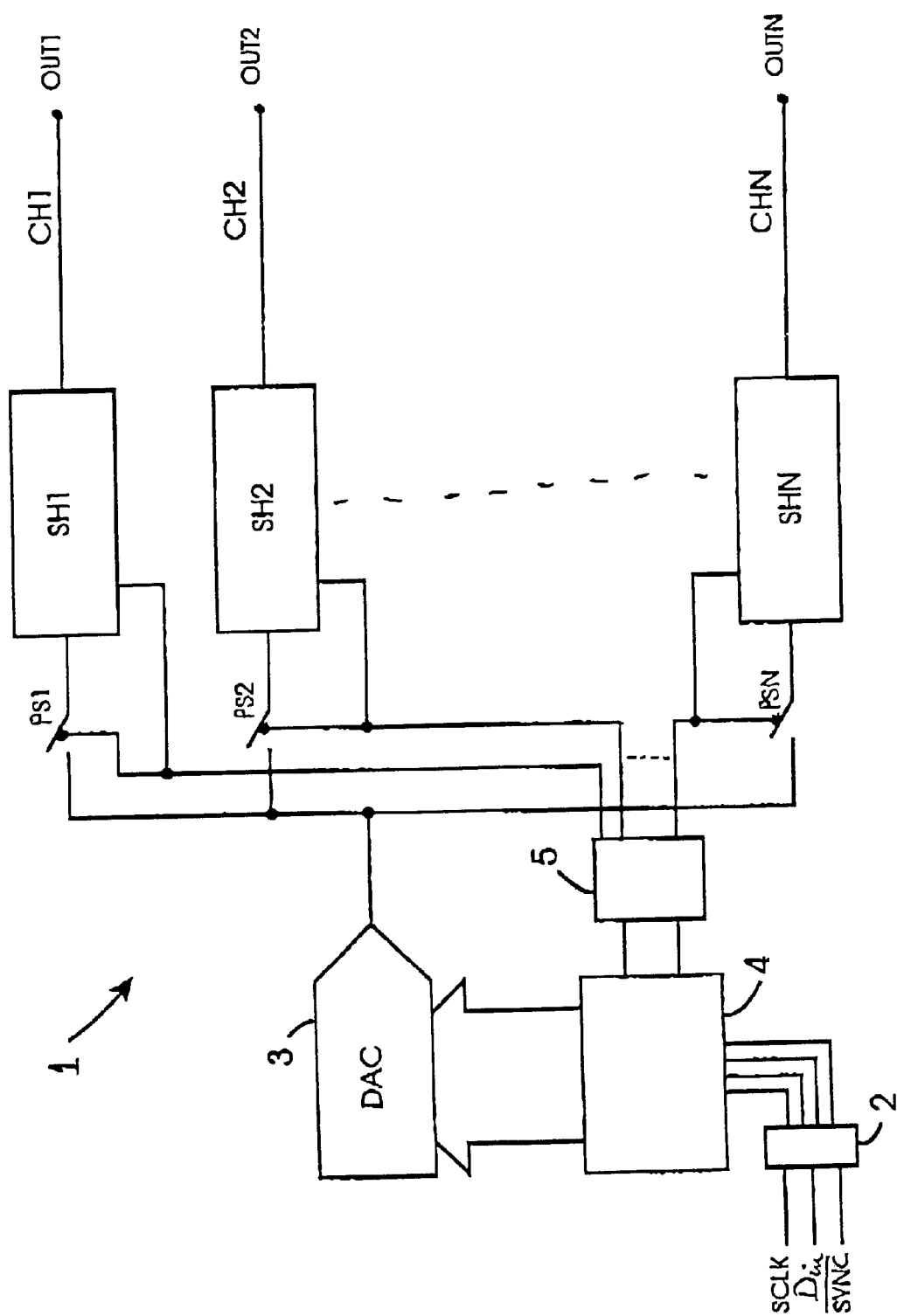
FIG. 1 is a circuit diagram of a multi-channel digital to analogue converting circuit according to the invention.
Figure 2:
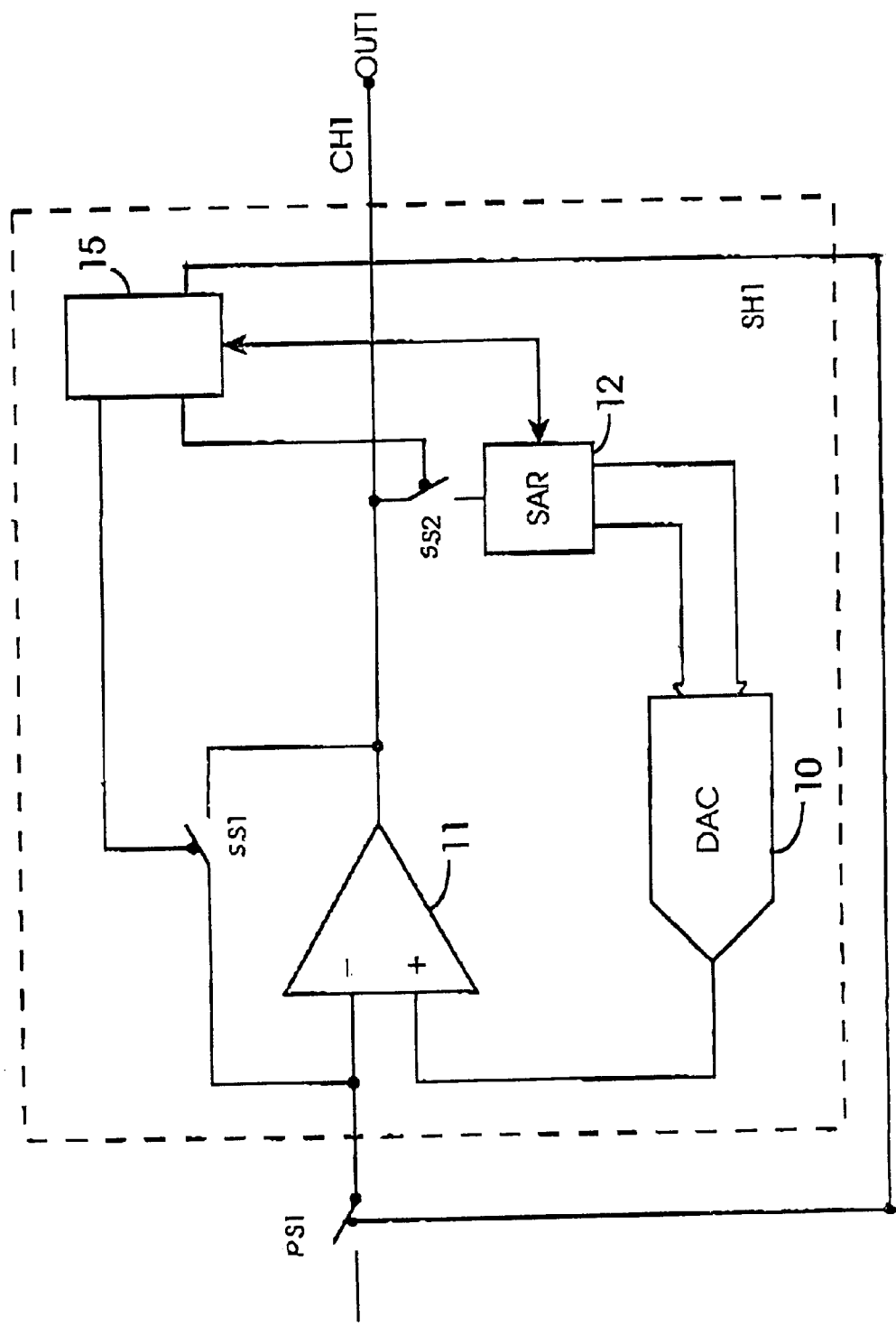
FIG. 2 is a circuit diagram of a portion of the multi-channel circuit of FIG. 1.

Referring to the drawings, and initially to FIGS. 1 and 2, there is illustrated a semiconductor multi-channel digital to analogue converting circuit indicated generally by the reference numeral 1 for converting digital input codes applied to an input port 2 of the circuit 1 to analogue signals which are outputted on analogue output terminals OUT1 to OUTN of corresponding channels CH1 to CHN. A data input pin $D_{in}$ for the digital input codes is provided in the input port 2 as is a clock pin SCLK for a synchronous clock signal for clocking the data on the data input pin $D_{in}$, and a synchronous frame signal pin SYNC is also provided in the input port 2. The multi-channel circuit 1 comprises a primary DAC 3 for receiving the digital input codes from the input port 2 through an interface control logic circuit 4 and for converting the digital input codes to analogue signals. The primary DAC 3 is a relatively accurate DAC so that the analogue signals outputted by the primary DAC 3 relatively accurately correspond to the digital input codes. In particular, the impedance elements (not shown) of the primary DAC 3 are relatively closely matched, thus providing the primary DAC 3 with a relatively good integral linearity. The analogue signals from the primary DAC 3 are selectively and sequentially sampled from the primary DAC 3 onto the channels CH1 to CHN through a primary switching mechanism which comprises primary switches PS1 to PSN in the corresponding channels CH1 to CHN respectively. A primary control circuit 5 selectively and sequentially operates the switches PS1 to PSN in response to data signals received through the input port 2 for determining the channels CH1 to CHN onto which the respective analogue signals outputted by the primary DAC 3 are to be sampled.

The channels CH1 to CHN comprise respective infinite sample and hold circuits SH1 to SHN which sample the analogue signal which is applied from the primary DAC 3 through the corresponding primary switches PS1 to PSN. The infinite sample and hold circuits SH1 to SHN apply and hold respective analogue signals on the corresponding analogue output terminal OUT1 to OUTN which are similar to the respective sampled analogue signals from the primary DAC 3, as will be described below. The infinite sample and hold circuits SH1 to SHN are similar to each other, and for convenience only one of the sample and hold circuits, namely, the sample and hold circuit SH1, will be described.

Referring to FIG. 2, the infinite sample and hold circuit SH1 comprises a secondary DAC 10, an amplifier 11 and a successive approximation register 12. A secondary switching mechanism which comprises first and second secondary switches SS1 and SS2, respectively, alternately configures the infinite sample and hold circuit SH1 to operate in an acquisition mode during which a digital code is derived which corresponds to an analogue output signal from the secondary DAC 10 which is similar to the analogue signal sampled from the primary DAC 3 and in a hold mode during which the derived digital code is latched onto the input to the secondary DAC 10, which in turn applies and holds the analogue signal corresponding to the derived digital code on the output terminal OUT1. A secondary control circuit 15 controls the operation of the first and second switches SS1 and SS2 as will be described below.

When the infinite sample and hold circuit SH1 is operating in the acquisition mode the first secondary switch SS1 is open and the second secondary switch SS2 is closed. With the first secondary switch SS1 closed the amplifier 11 is configured as a comparator, and when the primary switch PS1 is closed, the analogue signal outputted by the primary DAC 3 is applied to the inverting input of the comparator 11. The output of the secondary DAC 10 is applied to the non-inverting input of the comparator 11. The output from the comparator 11 is applied through the second secondary switch SS2 to the successive approximation register 12, which drives the successive approximation register 12 to output digital codes to the secondary DAC 10 until the value of the analogue output signal from the secondary DAC 10 closely approximates to the value of the analogue signal sampled from the primary DAC 3. Accordingly, the comparator 11 and the successive approximation register 12 together act as an analogue to digital circuit for deriving the digital code corresponding to an analogue signal outputted by the secondary DAC 10 which approximates to the analogue signal from the primary DAC 3 sampled by the infinite sample and hold circuit SH1. The secondary control circuit 12 switches the infinite sample and hold circuit SH1 to the hold mode when the analogue output signal from the secondary DAC 10 has been approximated to the analogue signal sampled from the primary DAC 3.

In the hold mode the first secondary switch SS1 is closed and the second secondary switch SS2 is opened. Opening the second secondary switch SS2 latches the digital code outputted by the successive approximation register 12, which is at the digital value corresponding to the analogue output of the secondary DAC 10 which is similar to the sampled analogue signal from the primary DAC 3. Closing the first secondary switch SS1 configures the amplifier 11 to act as a buffer, and the analogue output from the secondary DAC 10 is buffered through the buffer 11 to the output terminal OUT1.

Simultaneously as the secondary control circuit 15 switches the infinite sample and hold circuit SH1 from the acquisition mode to the hold mode, the primary control circuit 5 switches the primary switch PS1 into the open state. Thus, the infinite sample and hold circuit SH1 is unaffected by the analogue output of the primary DAC 3 until the next analogue output of the primary DAC 3 is to be sampled. For so long as the primary switch PS1 is open, the infinite sample and hold circuit SH1 is held in the hold mode by the secondary control circuit 15 and the latched digital code in the successive approximation register 12 is latched onto the secondary DAC 10 which in turn outputs the analogue signal corresponding to the analogue signal sampled from the primary DAC 3 to the output terminal OUT1. Closing the primary switch PS1 causes the next analogue output from the primary DAC 3 to be sampled onto the infinite sample and hold circuit SH1. As the primary switch PS1 is being closed the secondary control circuit 15 under the control of the primary control circuit 5 switches the infinite sample and hold circuit SH1 from the hold to the acquisition mode for acquiring and subsequently holding an analogue signal on the output OUT1 similar to the sampled analogue signal from the primary DAC 3.

Appropriate circuitry including timing and feedback circuits are also provided but not illustrated for operating the primary switches PS1 to PSN and the secondary switches SS1 and SS2 of the respective sample and hold circuits SH1 to SHN in the appropriate sequences under the control of the primary control circuit 5 and the secondary control circuit 15. However, such timing and feedback circuits will be well known to those skilled in the art, and it is not intended to describe them further in this specification. Additionally, a power input pin and a ground pin, neither of which are shown are provided for powering the circuit 1, as are other necessary inputs and outputs which will be well known to those skilled in the art.

In use, the primary DAC 3 outputs analogue signals corresponding to the digital input codes inputted through the input port 2, and under the control of the primary control circuit 5 the primary switches PS1 to PSN are selectively and sequentially operated for sampling the analogue signals outputted by the primary DAC 3 onto the selected ones of the infinite sample and hold circuits SH1 to SHN in the channels CH1 to CHN. Simultaneously with the switches PS1 to PSN being selectively switched for sampling the analogue signals from the primary DAC 3 onto the selected ones of the infinite sample and hold circuits SH1 to SHN, the corresponding infinite sample and hold circuits SH1 to SHN are configured into the acquisition mode for driving the corresponding successive approximation registers 12 to output the digital code corresponding to the analogue output of the corresponding secondary DAC 10 which approximates to the sampled analogue output of the primary DAC 3. On the secondary DAC 10 of each sample and hold circuit SH1 to SH10 outputting the analogue signal approximating to the sampled analogue signal from the primary DAC 3, that infinite sample and hold circuit SH1 to SHN is configured by the secondary control circuit 15 into the hold mode to hold the analogue signal outputted by the secondary DAC 10 on the corresponding output OUT1 to OUTN and the corresponding primary switch PS1 to PSN is opened. When the next analogue output of the primary DAC is to be sampled onto one or more of the infinite sample and hold circuits SH1 to SHN the appropriate primary switch or switches PS1 to PSN is closed, and the corresponding infinite sample and hold circuit or circuits SH1 to SHN are configured into the acquisition mode for driving the successive approximation register 12 and the secondary DAC 10 to output an analogue signal approximating to the sampled analogue signal from the primary DAC 3.

Figure 3:
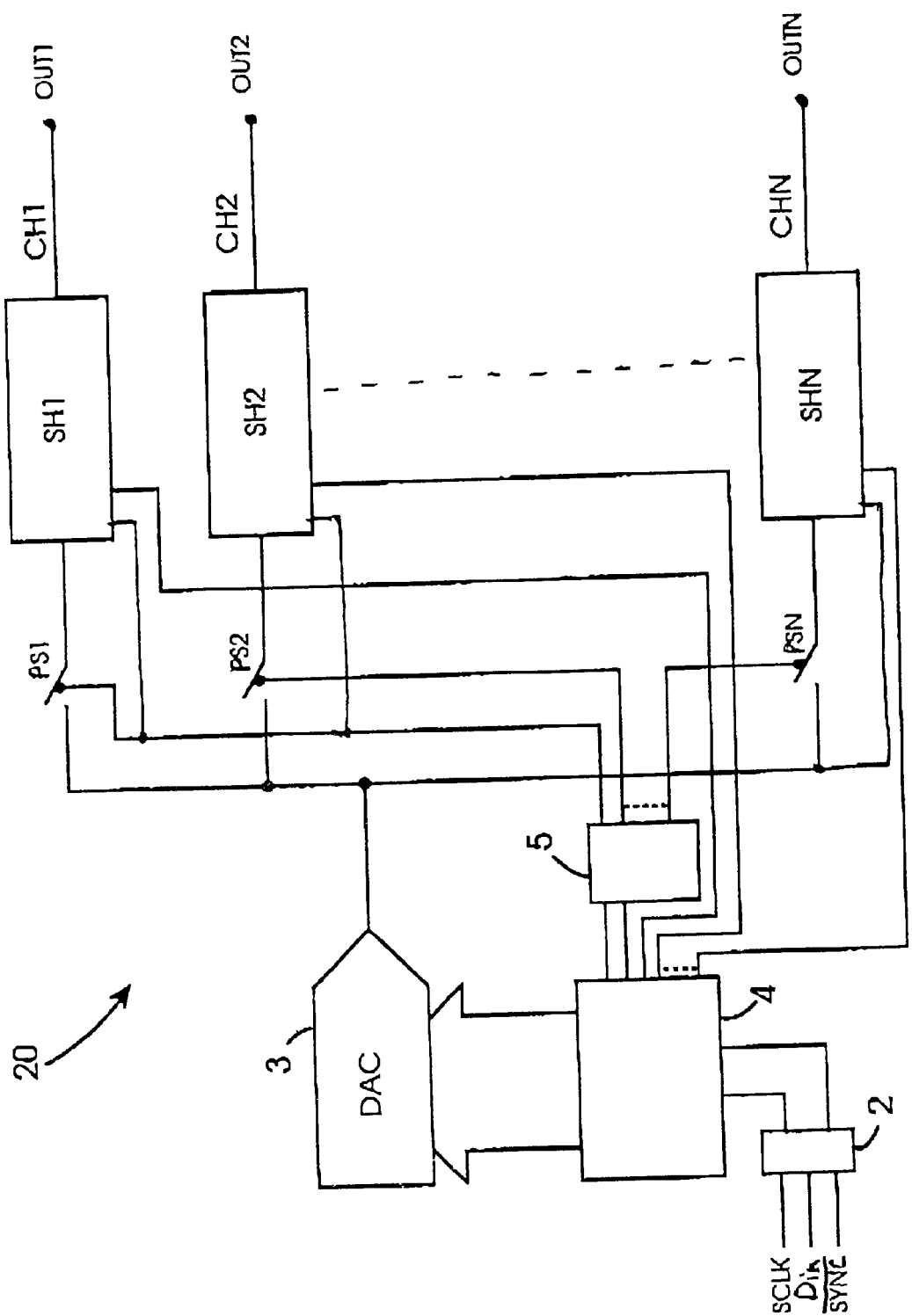
FIG. 3 is a circuit diagram of a multi-channel digital to analogue converting circuit according to another embodiment of the invention.
Figure 4:
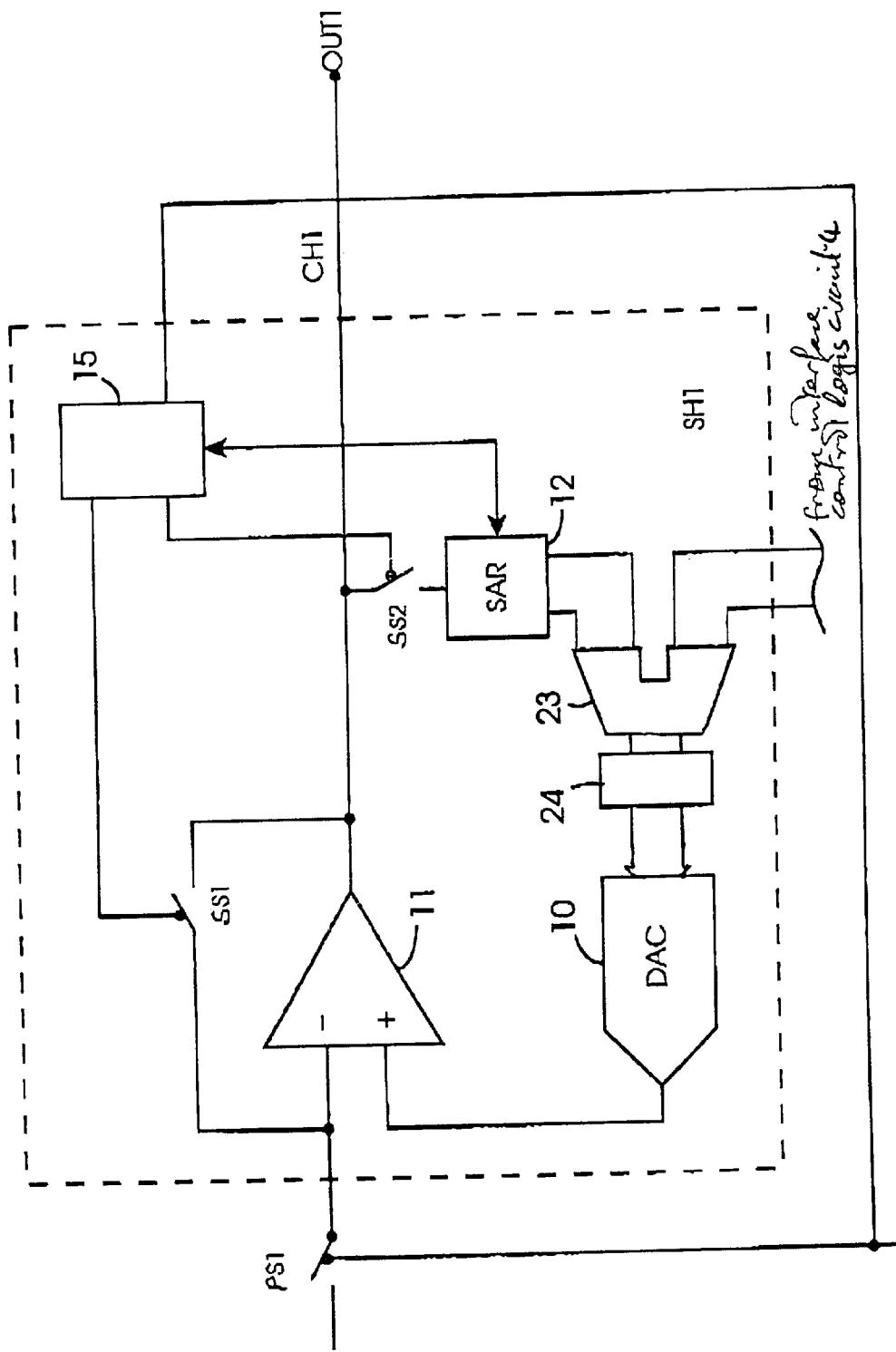
FIG. 4 is a circuit diagram of a portion of the multi-channel circuit of FIG. 3.

Referring now to FIGS. 3 and 4, a multi-channel digital to analogue converting circuit according to another embodiment of the invention indicated generally by the reference numeral is illustrated. The circuit 20 is substantially similar to the multi-channel digital to analogue converting circuit 1 described with reference to FIGS. 1 and 2, and similar components are identified by the same reference numerals. The main difference between the circuit 20 and the circuit 1 is that the input port 2 accommodates primary digital input codes and a secondary digital input codes. The primary digital input codes are delivered through the input port 2 to the input of the primary DAC 3 in similar fashion as the digital input codes are delivered through the interface control logic circuit 4 to the primary DAC 3 of the multi-channel circuit 1. However, the secondary digital input codes are selectively gated through the interface control logic circuit 4 to selected ones of the infinite sample and hold circuits SH1 to SHN when the selected infinite sample and hold circuits are in the hold mode for facilitating incrementing or decrementing the analogue signal held on the corresponding outputs OUT1 to OUTN. The secondary digital input codes are applied to adders 23 in the corresponding infinite sample and hold circuits SH1 to SHN where the secondary digital input code is added to the derived code latched in the successive approximation register 12. A latch 24 latches the summed codes from the adder 23 to the input of the secondary DAC 10, which in turn correspondingly incrementally or decrementally alters the analogue signal outputted by the secondary DAC 10, and thus on the corresponding output OUT1 to OUTN.

In this embodiment of the invention the secondary DACs 10 are relatively high resolution DACs, and have a higher resolution and better differential linearity performance than the primary DAC 3. This thereby permits the overall resolution of the multi-channel digital to analogue circuit 20 to be increased. Once the resolution and the differential linearity of the secondary DACs 10 of the respective infinite sample and hold circuits SH1 to SHN is higher than that of the primary DAC 3, the integral linearity of the respective secondary DACs 10 is less important than that of the primary DAC 3, since the secondary DACs 10 only increment or decrement the least significant bits (LSB) of the primary digital code applied to the primary DAC 3. For example, by providing the primary DAC 3 with a twelve-bit good integral linearity performance, and each of the secondary DACs 10 with a fourteen-bit good differential linearity performance, a multi-channel accurate digital to analogue converting circuit with a fourteen-bit differential linearity performance is provided while the infinite sample and hold circuits SH1 to SHN are configured in the hold mode during which the secondary digital input codes may be inputted to the infinite sample and hold circuits SH1 to SHN for incrementing or decrementing the value of the analogue signal on the corresponding outputs OUT1 to OUTN. Such a circuit is particularly useful in industrial closed-loop control applications where good differential linearity performance is important, and where it is important to be able to adjust the analogue output signal in relatively small increments.

Operation of the multi-channel digital to analogue converting circuit 20 is substantially similar to that of the multi-channel digital to analogue converting circuit 1 described with reference to FIGS. 1 and 2, with the exception that when the respective infinite sample and hold circuits SH1 to SHN have been switched from the acquisition to the hold mode the secondary digital codes may then be selectively gated to the respective selected infinite sample and hold circuits SH1 to SHN for incrementing or decrementing the corresponding analogue signal held on the corresponding output OUT1 to OUTN in response to the secondary digital input codes.

Figure 5:
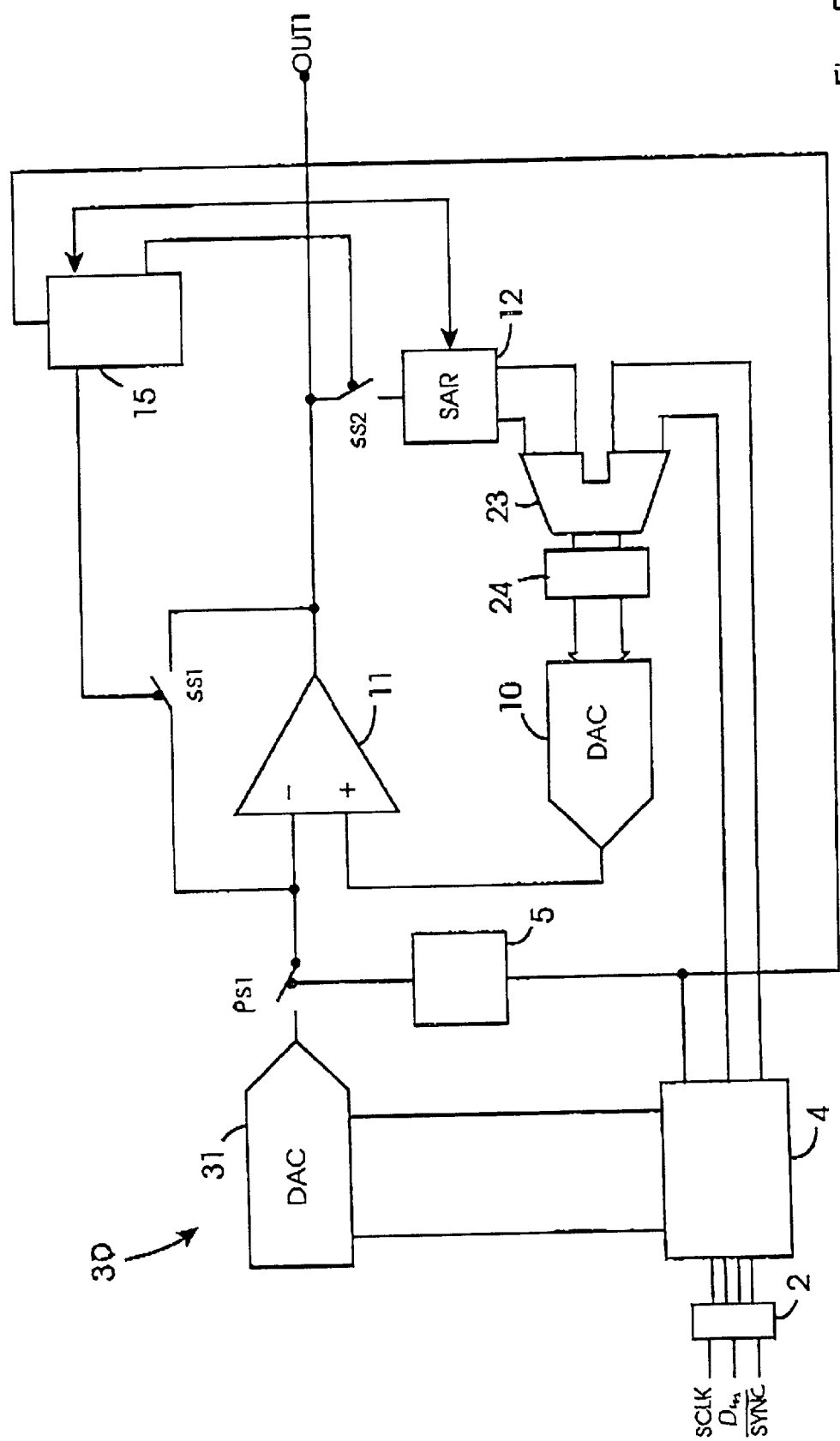
FIG. 5 is a circuit diagram of a single channel digital to analogue converting circuit according to a further embodiment of the invention.

Referring now to FIG. 5, there is illustrated a single channel digital to analogue converting circuit according to a further embodiment of the invention indicated generally by the reference numeral 30. The circuit 30 comprises a primary DAC 31 which is similar to the primary DAC 3 and is a relatively accurate DAC having good integral linearity performance. However, in this embodiment of the invention only a single infinite sample and hold circuit SH1 is provided. The infinite sample and hold circuit SH1 is similar to the infinite sample and hold circuits SH1 to SHN of the circuit 20, and similar components are identified by the same reference numerals. The infinite sample and hold circuit SH1 samples the analogue output from the primary DAC 31 when the infinite sample and hold circuit SH1 is operating in the acquisition mode, and remains in the acquisition mode until the appropriate digital code has been derived for holding the analogue output of the secondary DAC 10 at the value of the sampled analogue signal from the primary DAC 31. At which stage the infinite sample and hold circuit SH1 is switched to the hold mode. When configured in the hold mode, a secondary digital input code can be inputted to the infinite sample and hold circuit SH1 for incrementing or decrementing the analogue signal on the output terminal OUT1 by an amount corresponding to the secondary digital input code. The primary and secondary input codes as already described with reference to the circuit 20 of FIGS. 3 and 4, are inputted through the input port 2 and are gated to the primary DAC 31 and the infinite sample and hold circuit SH1, respectively through the interface control logic circuit 4. The secondary digital input codes are added to the derived digital code from the successive approximation register 12 in the adder 23 and latched onto the input to the secondary DAC 10 by the latch 24. This circuit 30 is particularly suitable for use in industrial closed-loop control circuits.

Operation of this circuit 30 is substantially similar to the circuit 20, in that the infinite sample and hold circuit SH1 is operated in the acquisition mode for sampling the analogue output from the primary DAC 3 and for driving the secondary DAC 10 to output an analogue signal approximating to the sampled analogue signal from the primary DAC 3. On the output of the secondary DAC 10 approximating to the sampled analogue signal, the infinite sample and hold circuit SH1 is configured into the hold mode for holding the analogue signal from the DAC 10 on the output terminal OUT1. Secondary digital input codes can then be applied to the secondary DAC 10 through the adder 23 for incrementing or decrementing the analogue signal on the output terminal OUT1.

While the analogue signals from the primary DAC of the circuits of FIGS. 1 to 4 have been described as being sequentially applied to the infinite sample and hold circuits, a single analogue output from the primary DAC could be simultaneously sampled onto some or all of the infinite sample and hold circuits.

It will of course be appreciated that the primary and secondary DACs may be current DACs or voltage DACs as desired.

It will also be appreciated that the digital input signals, both primary and secondary digital input signals, may be inputted as serial data or parallel data signals as desired.

What is claimed is:

1. A multi-channel digital to analog circuit for converting digital codes to analog signals, the circuit comprising:

a primary digital to analog converter (DAC) for receiving digital input codes and outputting corresponding analog signals, a plurality of infinite sample-and-hold circuits for sampling the analog signals outputted by the primary DAC and for holding analog signals similar to the corresponding analog signals sampled from the primary DAC, the infinite sample-and-hold circuits defining respective analog outputs of the multi-channel circuit on which the respective analog signals similar to the corresponding sampled analog signals are held, each infinite sample-and-hold circuit comprising a secondary DAC having an analog output from which the analog signal held on the analog output of the corresponding infinite sample-and-hold circuit is derived, and an analog to digital converting circuit for converting each analog signal sampled from the primary DAC by the corresponding infinite sample-and-hold circuit to a digital code for applying to the corresponding secondary DAC so that the analog signal outputted by the secondary DAC is similar to the corresponding sampled analog signal, and a primary switching mechanism for selectively sampling analog signals outputted by the primary DAC onto the infinite sample-and-hold circuits.

2. A multi-channel circuit as claimed in claim 1 in which the primary switching mechanism sequentially samples the analog signals outputted by the primary DAC onto respective selected ones of the infinite sample-and-hold circuits.

3. A multi-channel circuit as claimed in claim 1 in which the primary switching mechanism simultaneously samples the analog signal outputted by the primary DAC onto respective selected ones of the infinite sample-and-hold circuits.

4. A multi-channel circuit as claimed in claim 1 in which the primary switching mechanism comprises a plurality of primary switches, one primary switch being provided for each infinite sample-and-hold circuit for selectively sampling the analog signal outputted by the primary DAC onto the corresponding infinite sample-and-hold circuit.

5. a multi-channel circuit as claimed in claim 4 in which a primary control circuit is provided for selectively addressing the primary switches of the primary switching mechanism.

6. A multi-channel circuit as claimed in claim 1 in which the digital code derived by the analog to digital converting circuit of each infinite sample-and-hold circuit is stored in the analog to digital converting circuit until the next analog signal is sampled by the infinite sample-and-hold circuit.

7. A multi-channel circuit as claimed in claim 1 in which each infinite sample-and-hold circuit is configurable to operate in an acquisition mode during which the digital code for the secondary DAC is derived, and in a hold mode during which the analog signal outputted by the secondary DAC is held on the analog output of the infinite sample-and-hold circuit.

8. A multi-channel circuit as claimed in claim 7 in which the analog to digital converting circuit of each infinite sample-and-hold circuit comprises a successive approximation register for deriving the digital code for the secondary DAC when the infinite sample-and-hold circuit is configured in the acquisition mode, and for latching the derived digital code onto the digital input of the secondary DAC when the infinite sample-and-hold circuit is configured in the hold mode.

9. A multi-channel circuit as claimed in claim 8 in which a secondary switching mechanism is provided in each infinite sample-and-hold circuit for configuring the infinite sample-and-hold circuit to operate in the respective acquisition and hold modes, the secondary switching mechanism being responsive to the successive approximation register having derived the digital code for the secondary DAC for switching the infinite sample-and-hold circuit from the acquisition mode to the hold mode, and being responsive to the primary switching mechanism sampling the next analog signal from the primary DAC to the infinite sample-and-hold circuit for switching the infinite sample-and-hold circuit from the hold mode to the acquisition mode.

10. A multi-channel circuit as claimed in claim 8 in which each infinite sample-and-hold circuit comprises an amplifier which is configurable as a buffer when the infinite sample-and-hold circuit is configured in the hold mode for applying the output from the secondary DAC to the analog output of the infinite sample-and-hold circuit, and the amplifier is configurable as a comparator when the infinite sample-and-hold circuit is configured in the acquisition mode for sequentially comparing the outputs of the secondary DAC with the sampled analog signal from the primary DAC and for outputting corresponding signals to the successive approximation register for driving the successive approximation register to derive digital code for the secondary DAC.

11. A multi-channel circuit as claimed in claim 7 in which a primary input is provided to the primary DAC for inputting a primary digital input code to the primary DAC, and at least one of the infinite sample-and-hold circuits is provided with a secondary input for inputting a secondary digital input code to the secondary DAC of the infinite sample-and-hold circuit for facilitating altering of the analog signal on the analog output of the infinite sample-and-hold circuit when the infinite sample-and-hold circuit is configured in the hold mode.

12. A multi-channel circuit as claimed in claim 11 in which each infinite sample-and-hold circuit is provided with a secondary input to the corresponding secondary DAC.

13. A multi-channel circuit as claimed in claim 1 in which each secondary DAC is of higher resolution than the primary DAC.

14. A multi-channel circuit as claimed in claim 1 in which the differential linearity of each secondary DAC is better than the differential linearity of the primary DAC.

15. A multi-channel circuit as claimed in claim 1 in which the integral linearity of the primary DAC is better than the integral linearity of each secondary DAC.

16. A digital to analog converting circuit comprising:
   a primary DAC having a primary input thereto for receiving a primary digital input code,
   an infinite sample-and-hold circuit for sampling the analog signals outputted by the primary DAC and for holding an analog signal similar to that sampled from the primary DAC on an analog output of the infinite sample-and-hold circuit, the infinite sample-and-hold circuit comprising
      a secondary DAC having an analog output from which the analog signal held on the analog output of the infinite sample-and-hold circuit is derived,
      an analog to digital converting circuit for deriving from each analog signal sampled by the infinite sample-and-hold circuit a digital code which corresponds to an analog signal from the secondary DAC which is similar to the sampled analog signal, and for applying the derived digital code to the secondary DAC,
      the infinite sample-and-hold circuit being configurable in an acquisition mode for deriving the digital code for the secondary DAC, and in a hold mode in which the analog signal outputted by the secondary DAC is held on the analog output of the infinite sample-and-hold circuit; and
   a secondary input being provided to the secondary DAC for inputting a secondary digital input code to the secondary DAC for altering the analog signal on the analog output of the infinite sample-and-hold circuit when the infinite sample-and-hold circuit is operating in the hold mode.

17. A digital to analog converting circuit as claimed in claim 16 in which the secondary DAC is of higher resolution than the primary DAC for increasing the overall resolution of the digital to analog circuit.

18. A digital to analog converting circuit as claimed in claim 16 in which the differential linearity of the secondary DAC is better than the differential linearity of the primary DAC.

19. A digital to analog converting circuit as claimed in claim 16 in which the integral linearity of the primary DAC is better than the integral linearity of the secondary DAC.

20. A multi-channel digital to analog circuit for converting digital codes to analog signals, the circuit comprising:
   a primary digital to analog converter (DAC) for receiving digital input codes and outputting corresponding analog signals,
   a plurality of infinite sample-and-hold circuits for sampling the analog signals outputted by the primary DAC and for holding analog signals similar to the corresponding analog signals sampled from the primary DAC, the infinite sample-and-hold circuits defining respective analog outputs of the multi-channel circuit on which the respective analog signals similar to the corresponding sampled analog signals are held, each infinite sample-and-hold circuit comprising a secondary DAC for applying the analog signal, which is similar to the sampled analog signal, to the analog output of the corresponding infinite sample-and-hold circuit, the analog signal being held on the output of the secondary DAC by a digital code which is derived from the corresponding sampled analog signal and applied to the secondary DAC; and
   a primary switching mechanism for selectively sampling analog signals outputted by the primary DAC onto the infinite sample-and-hold circuits.

21. A multi-channel digital to analog circuit for converting digital codes to analog signals, the circuit comprising:
   a primary digital to analog converter (DAC) for receiving digital input codes and outputting corresponding analog signals,
   a plurality of infinite sample-and-hold circuits for sampling the analog signals outputted by the primary DAC and for holding analog signals similar to the corresponding analog signals sampled from the primary DAC, the infinite sample-and-hold circuits defining respective analog outputs of the multi-channel circuit on which the respective analog signals similar to the corresponding sampled analog signals are held, each infinite sample-and-hold circuit comprising a secondary DAC for applying the analog signal, which is similar to the sampled analog signal, to the analog output of the corresponding infinite sample-and-hold circuit,
   an analog to digital converting circuit for converting the analog signals sampled from the primary DAC to digital codes for applying to the corresponding secondary DACs so that the analog signals outputted by the secondary DACs are similar to the corresponding sampled signals from the primary DAC; and
   a primary switching mechanism for selectively sampling analog signals outputted by the primary DAC onto the infinite sample-and-hold circuits.

* * * * *